(12) United States Patent
Takaoka

(10) Patent No.: US 7,064,005 B2
(45) Date of Patent: Jun. 20, 2006

(54) SEMICONDUCTOR APPARATUS AND METHOD OF MANUFACTURING SAME

(75) Inventor: Yuji Takaoka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/474,863

(22) PCT Filed: May 10, 2002

(86) PCT No.: PCT/JP02/04572

§ 371 (c)(1),
(2), (4) Date: Oct. 8, 2003

(87) PCT Pub. No.: WO02/101831

PCT Pub. Date: Dec. 19, 2002

(65) Prior Publication Data

US 2004/0115919 A1    Jun. 17, 2004

(30) Foreign Application Priority Data

May 14, 2001    (JP)    ............................. 2001-143045

(51) Int. Cl.
*H01L 21/44* (2006.01)
*H01L 21/48* (2006.01)
*H01L 21/50* (2006.01)
*H01L 21/30* (2006.01)
*H01L 21/46* (2006.01)

(52) U.S. Cl. ...................... 438/108; 438/617; 438/459; 438/977

(58) Field of Classification Search ................ 438/459, 438/977, FOR. 485
See application file for complete search history.

(56) References Cited

U.S. PATENT DOCUMENTS

| 4,922,377 A | | 5/1990 | Matsumoto et al. | |
| 4,978,639 A | * | 12/1990 | Hua et al. | 438/465 |
| 5,260,169 A | * | 11/1993 | Nakano | 430/314 |
| 5,268,326 A | * | 12/1993 | Lesk et al. | 438/406 |
| 5,270,261 A | * | 12/1993 | Bertin et al. | 438/109 |
| 5,313,366 A | | 5/1994 | Gaudenzi et al. | |
| 5,463,246 A | * | 10/1995 | Matsunami | 257/621 |
| 5,504,036 A | * | 4/1996 | Dekker et al. | 438/666 |
| 5,618,752 A | * | 4/1997 | Gaul | 438/626 |
| 5,627,106 A | * | 5/1997 | Hsu | 438/459 |
| 5,646,067 A | * | 7/1997 | Gaul | 438/458 |
| 5,691,248 A | * | 11/1997 | Cronin et al. | 438/109 |
| 5,804,495 A | * | 9/1998 | Saito et al. | 438/459 |

(Continued)

FOREIGN PATENT DOCUMENTS

JP    03-292761    12/1991

(Continued)

*Primary Examiner*—David E. Graybill
(74) *Attorney, Agent, or Firm*—Sonnenschein Nath & Rosenthal LLP

(57) ABSTRACT

A semiconductor apparatus that allow miniaturization of a multichip module using an interposer substrate and a method of manufacturing the same are provided. It is configured that an embedded electrode (4) penetrating through an interposer substrate (1) is provided, one end thereof is made to be connected to a connection electrode (2) on which device chips (10) are flip-chip mounted, and connecting to an unillustrated mounting substrate via a bump electrode (5), that is, because an electrode connecting the mounting substrate is made to be drawn out from the back surface of the interposer substrate (1), a multichip module can be miniaturized.

8 Claims, 5 Drawing Sheets

U.S. PATENT DOCUMENTS

| | | | | |
|---|---|---|---|---|
| 5,807,783 | A * | 9/1998 | Gaul et al. | 438/406 |
| 5,846,879 | A * | 12/1998 | Winnerl et al. | 438/666 |
| 5,872,025 | A * | 2/1999 | Cronin et al. | 438/109 |
| 6,054,365 | A * | 4/2000 | Lizotte | 438/430 |
| 6,114,191 | A * | 9/2000 | Young et al. | 438/125 |
| 6,127,274 | A * | 10/2000 | Igel et al. | 438/710 |
| 6,184,060 | B1 * | 2/2001 | Siniaguine | 438/106 |
| 6,251,705 | B1 * | 6/2001 | Degani et al. | 438/108 |
| 6,322,903 | B1 * | 11/2001 | Siniaguine et al. | 428/617 |
| 6,420,209 | B1 * | 7/2002 | Siniaguine | 438/108 |
| 6,498,381 | B1 * | 12/2002 | Halahan et al. | 257/449 |
| 6,506,681 | B1 * | 1/2003 | Grigg et al. | 438/692 |
| 6,593,644 | B1 * | 7/2003 | Chiu et al. | 257/684 |
| 6,639,303 | B1 * | 10/2003 | Siniaguine | 257/621 |
| 6,683,368 | B1 * | 1/2004 | Mostafazadeh | 257/676 |
| 6,689,640 | B1 * | 2/2004 | Mostafazadeh | 438/121 |
| 6,717,254 | B1 * | 4/2004 | Siniaguine | 257/690 |
| 6,800,508 | B1 * | 10/2004 | Kimura | 438/123 |
| 2002/0115290 | A1 * | 8/2002 | Halahan et al. | 438/667 |

FOREIGN PATENT DOCUMENTS

| | | |
|---|---|---|
| JP | 10-233463 | 9/1998 |
| WO | WO 9819337 A1 * | 5/1998 |

* cited by examiner

SEMICONDUCTOR APPARATUS AND METHOD OF MANUFACTURING SAME

The present invention relates to a semiconductor apparatus suitable for a multichip module and a method of manufacturing the same.

In recent years, technologies are known such as mounting a plurality of device tips of CSP (Chip Size Package) structure on a substrate, constituting a semiconductor apparatus called as a multichip module in which a plurality of device chips are flip-chip mounted on an interposer substrate. The technology of flip-chip mounting of device chips on an interposer substrate is disclosed in, for example, Patent Publication No. 2000-164635.

By the way, in a semiconductor apparatus 100 constituting a multichip module by use of an interposer substrate, as shown in a sectional view of FIG. 5, it is configured in such a way that each device chips 10 and bumps 10a formed on 10 are connected to connection electrodes 2 on an interposer substrate 1. In such a connection configuration, wiring between each device chips are possible to be miniaturized, however, connection terminals T formed at peripheral parts of the interposer substrate 1 are used to connect the semiconductor apparatus 100 to an unillustrated mounting substrate.

For this reason, as the number of the connection terminals T increases on the interposer substrate 1, the area of the interposer substrate needs to be expanded in order to provide the connection terminals thereon, and it becomes a factor that blocks miniaturization of the multichip module.

Consequently, the present invention is directed in view of such circumstances, and an object thereof is to provide a semiconductor apparatus which can miniaturize a multichip module with the use of an interposer substrate and a method of manufacturing the same.

SUMMARY OF THE INVENTION

In order to achieve the above mentioned object, in the present invention, there is provided a semiconductor apparatus constituting a multichip module by flip-chip mounting a plurality of device chips on an interposer substrate characterized by: providing an embedded electrode penetrating through the interposer substrate; connecting one end thereof to a connection electrode on which the device chips are flip-chip mounted; and forming a bump electrode at the other end thereof.

Further, in the present invention, there is provided a method of manufacturing a semiconductor apparatus constituting a multichip module by flip-chip mounting a plurality of device chips on an interposer substrate characterized by including: a first step for forming an embedded electrode by filling a contact hall penetrating through a wafer, which is a base material of the interposer substrate, with conductor; a second step for forming wiring including a connection electrode connected to the one end of the embedded electrode and a connection electrode on which the device chips are flip-chip mounted on a surface of the wafer; a third step for forming the interposer substrate by grinding and polishing a back surface of the wafer until the other end of the embedded electrode is exposed, after the plurality of device chips are flip-chip mounted on the connection electrode formed in the second step; and a forth step for providing a bump electrode on the other end of the embedded electrode exposed in the third step.

In the present invention, it is configured that an embedded electrode penetrating through an interposer substrate is provided, and one end thereof is made to be connected to a connection electrode on which the device chips are flip-chip mounted, and then a bump electrode at the other end thereof is formed, so that an electrode connecting to a mounting substrate can be drawn out from the back surface of the interposer substrate. Therefore, it is possible to miniaturize a multichip module.

DETAILED DESCRIPTION OF THE PRESENTLY PREFERRED EMBODIMENTS

Figure 1:
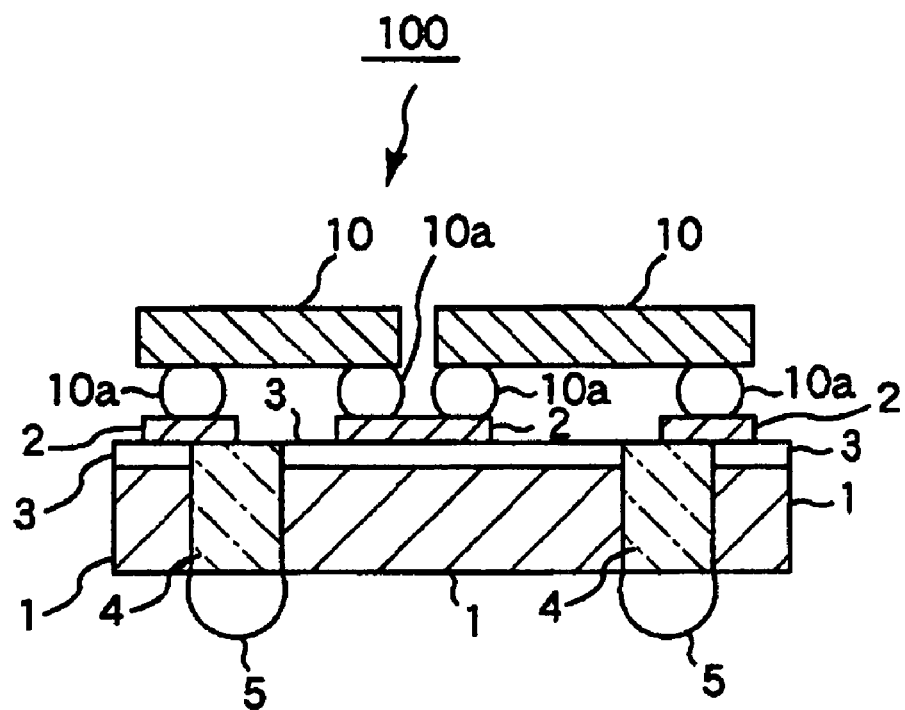
FIG. 1 is a sectional view showing configuration of a semiconductor apparatus 100 in the present embodiment.

Hereinafter, one embodiment of the present invention will be described with reference to drawings. FIG. 1 is a sectional view showing a configuration of a semiconductor apparatus 100 in accordance with the embodiment. In this diagram, the same numerals are given for the common parts in the conventional embodiment described previously (refer to FIG. 5), and the explanations about them are omitted.

Figure 5:
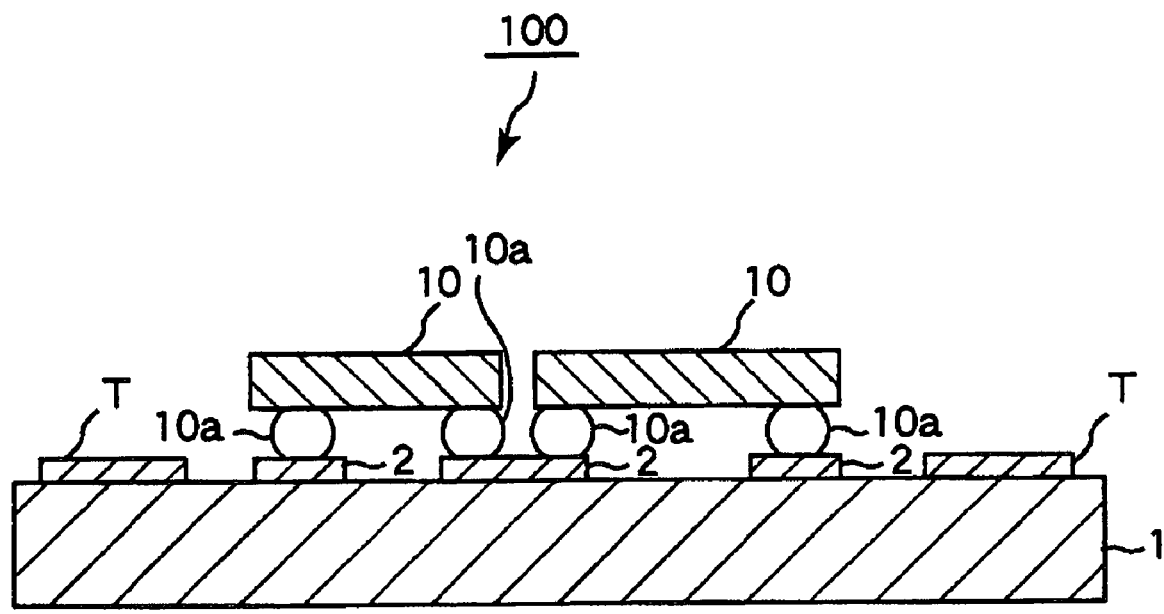
FIG. 5 is a diagram explaining a conventional embodiment.

With respect to the difference between the semiconductor apparatus 100 showing FIG. 1 and the conventional embodiment in FIG. 5 is the configuration in which an embedded electrode 4 penetrating through an interposer substrate 1 is provided, one end thereof is made to be connected to connection electrodes 2 on which device chips 10 are flip-chip mounted, and connected to an unillustrated mounting substrate via a bump electrodes 5 at the other end thereof. According to such a configuration, connection terminals T formed at peripheral parts of the interposer substrate 1 are unnecessary, so that the multichip module can be miniaturized.

Figure 2A:
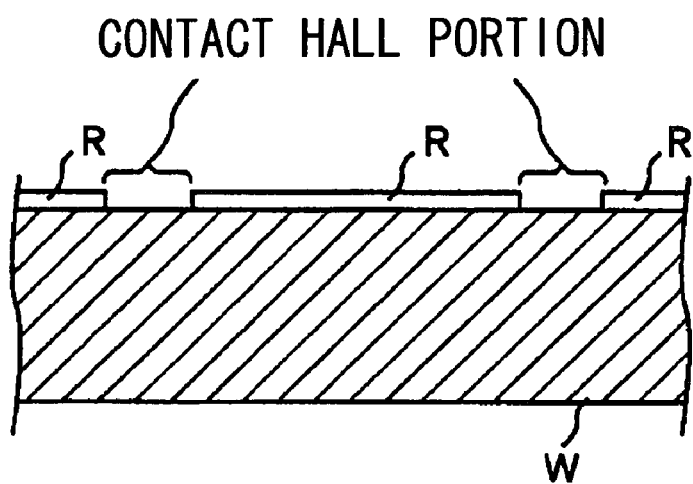
FIGS. 2A to 2B are diagrams explaining manufacturing process of the semiconductor apparatus 100.
Figure 2B:
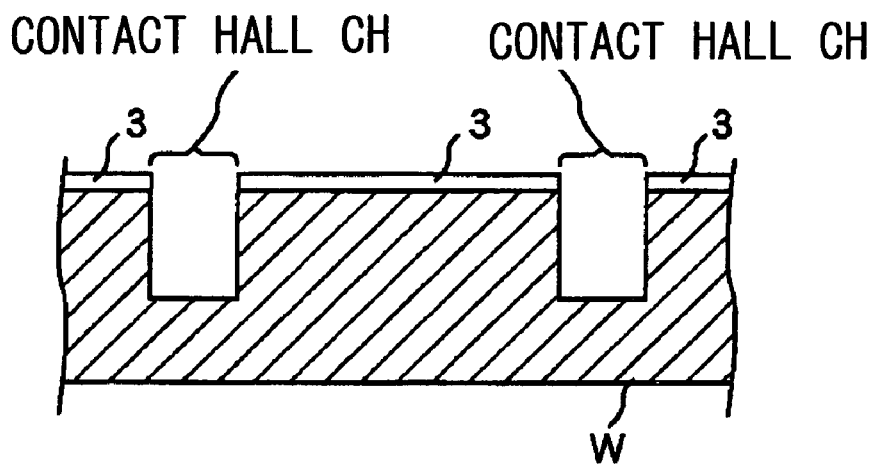

Next, with reference to FIG. 2A to FIG. 2B, FIG. 3A to FIG. 3B and FIG. 4A to FIG. 4C, manufacturing processes of the semiconductor apparatus 100 configured as mentioned above will be described. In the manufacturing processes of the present embodiment, at first, as shown in FIG. 2A, on a surface of a wafer W made of, for example, a silicon substrate which is a base material of an interposer substrate 1, and a resist R is patterned to make openings so as to correspond to contact holes CH described later. Next, etching process is performed on the wafer W with the resist R as a mask. The contact holes CH of 50 to 100 µm depth are formed in a way shown in FIG. 2B. After the contact holes CH are formed, the resist R is removed and an oxide film 3 of 3 to 4 µm film thickness is formed on the surface of the wafer W.

Figure 3A:
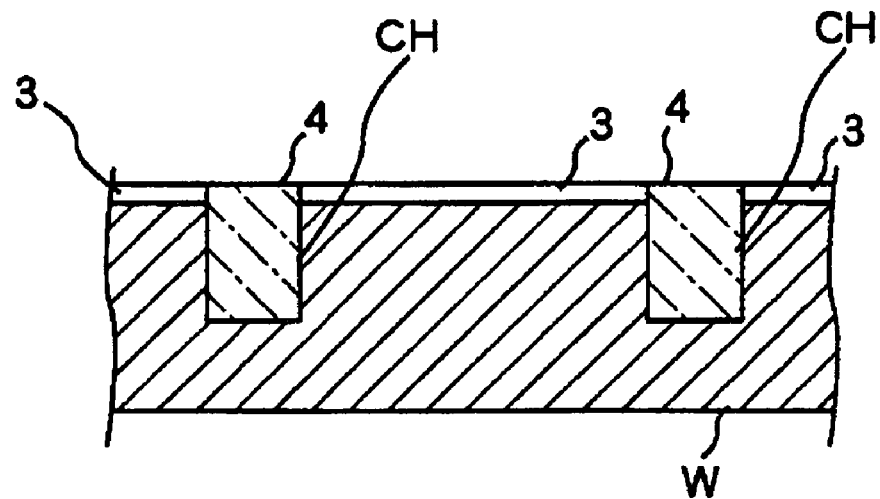
FIGS. 3A to 3B are diagrams explaining manufacturing process of the semiconductor apparatus 100.
Figure 3B:
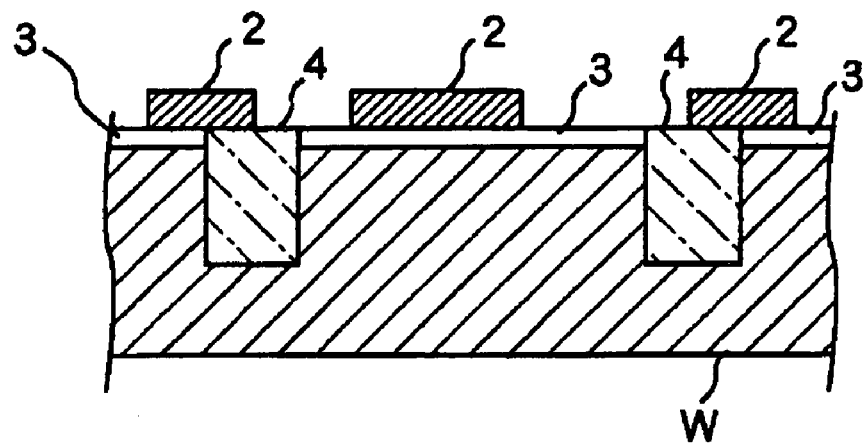
Figure 4A:
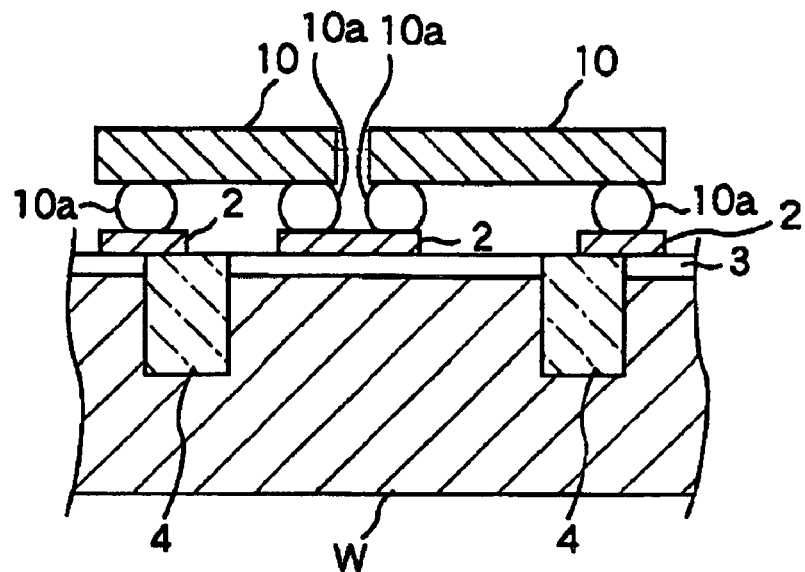
FIGS. 4A to 4C are diagrams explaining manufacturing process of the semiconductor apparatus 100.

Next, as shown in FIG. 3, an electroless plating method, for example, is used to form an embedded electrode 4 by filling good conductors such as copper, gold or an alloy of those into the contact holes CH. After the embedded electrodes 4 are formed in this manner, a plurality of connection electrodes 2 are formed on the oxide film 3 or on the embedded electrodes 4 (refer to FIG. 3B). After this, as shown in FIG. 4A, the flip-chip mounting is carried out in order to connect the connection electrodes 2 formed on the wafer W to the each device chips 10 and to bumps 10*a* of 10.

Figure 4B:
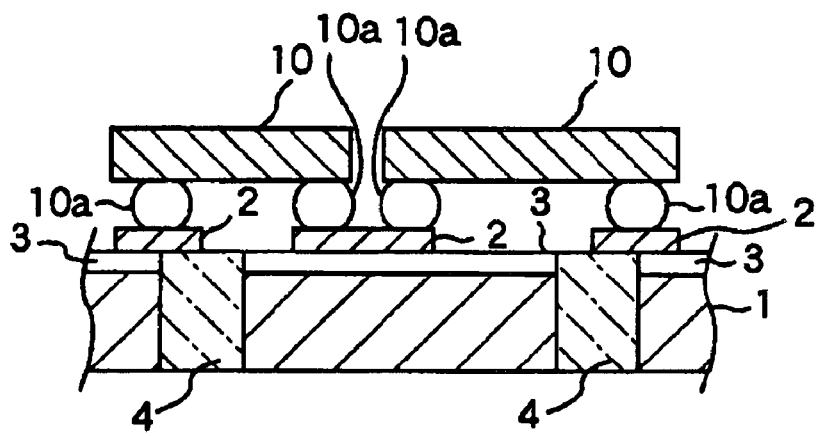
Figure 4C:
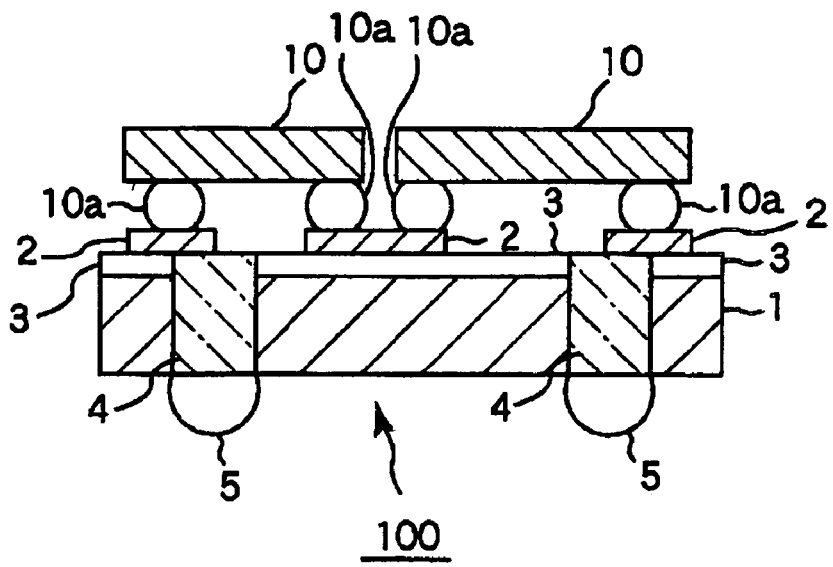

After the flip-chip mounting is carried out, as shown in FIG. 4B, a back surface of wafer W is grinded and polished by backgrinding until bottoms of the electrodes 4 are exposed, and the thin filmed interposer substrate 1 is formed in this way. As shown in FIG. 4C, after bump electrodes 5 are provided at the end of the embedded electrodes 4 exposed at the back surface of the interposer substrate 1, the semiconductor apparatus 100 of the multichip module is formed as shown in FIG. 1 by dicing the interposer substrate 1 into small pieces.

As described above, according to the present invention, it is possible to configure in such a way that the embedded electrode is provided, and the one side thereof is made to be connected to the connection electrode on which the device chips are flip-chip mounted, and then connected to an unillustrated mounting substrate via bumps 5 at the other side thereof, that is, the electrodes connecting to the mounting substrate can be drawn out from the back surface of the interposer substrate 1, so that the multichip module can be miniaturized.

According to the present invention, it is possible to configure in such a way that the embedded electrode penetrating through the interposer substrate is provided, and the one side thereof is made to be connected to the connection electrode on which device chips are flip-chip mounted, and then the bump electrode is formed at the other end thereof, so that the electrode connecting to the mounting substrate can be drawn out from the back surface of the interposer substrate, therefore, the multichip module can be miniaturized.

Further, according to the present invention, after the embedded electrode is formed by filling the contact hole penetrating through the wafer, which is the base material of the interposer substrate, with the conductor, the interposer substrate is formed by grinding and polishing the back surface of the wafer until the other end of the electrode is exposed, so that the electrode connecting to the mounting substrate from the back surface of the interposer is formed easily, and it can be contributed for the cost reduction.

The invention claimed is:

1. A method of manufacturing a semiconductor apparatus constituting a multichip module wherein a plurality of device chips are flip-chip mounted on an interposer substrate, characterized by comprising:

a first step for forming an embedded electrode by filling a contact hall penetrating through a wafer with conductor, said wafer being a base material of said interposer substrate;

a second step for forming wiring including a connection electrode connected to a first end of the embedded electrode and a connection electrode on which said device chips to be flip-chip mounted on a surface of said wafer;

a third step for forming said interposer substrate by grinding and polishing a back surface of said wafer until a second end of said embedded electrode is exposed after said plurality of device chips are flip-chip mounted on said connection electrode formed in the second step; and a fourth step for providing a bump electrode on the second end of said embedded electrode exposed in the third step.

2. A method for manufacturing a semiconductor apparatus according to claim 1, characterized in that said interposer substrate comprises a silicon substrate.

3. A method for manufacturing a semiconductor apparatus according to claim 1 wherein after performing the third step, the second end of said embedded electrode does not protrude past the back surface of the wafer.

4. A method for manufacturing a semiconductor apparatus according to claim 1 wherein after performing the third step, the second end of said embedded electrode is substantially even with the back surface of the wafer.

5. A method of manufacturing a semiconductor apparatus constituting a multichip module wherein a plurality of device chips are flip-chip mounted on an interposer substrate, characterized by comprising:

a first step for forming an embedded electrode by filling a contact hail penetrating through a wafer with conductor, said wafer being a base material of said interposer substrate;

a second step for forming wiring including a connection electrode connected to a first end of the embedded electrode, whereby a device chip can be flip-chip mounted to the connection electrode;

a third step for forming said interposer substrate by grinding and polishing a back surface of said wafer until a second end of said embedded electrode is exposed; and a fourth step for providing a bump electrode on the second end of said embedded electrode exposed in the third step.

6. A method for manufacturing a semiconductor apparatus according to claim 5, characterized in that said interposer substrate comprises a silicon substrate.

7. A method for manufacturing a semiconductor apparatus according to claim 5 wherein after performing the third step, the second end of said embedded electrode does not protrude past the back surface of the wafer.

8. A method for manufacturing a semiconductor apparatus according to claim 5 wherein after performing the third step, the second end of said embedded electrode is substantially even with the back surface of the wafer.

* * * * *